(12) United States Patent
Fujii et al.

(10) Patent No.: US 7,768,178 B2
(45) Date of Patent: Aug. 3, 2010

(54) PIEZOELECTRIC DEVICE, PIEZOELECTRIC ACTUATOR, AND LIQUID DISCHARGE DEVICE HAVING PIEZOELECTRIC FILMS

(75) Inventors: Takamichi Fujii, Kanagawa-ken (JP); Tsuyoshi Mita, Kanagawa-ken (JP); Yoshikazu Hishinuma, Kanagawa-ken (JP)

(73) Assignee: Fujifilm Corporation, Tokyo (JP)

( * ) Notice: Subject to any disclaimer, the term of this patent is extended or adjusted under 35 U.S.C. 154(b) by 5 days.

(21) Appl. No.: 12/178,761

(22) Filed: Jul. 24, 2008

(65) Prior Publication Data

US 2009/0026887 A1  Jan. 29, 2009

(30) Foreign Application Priority Data

Jul. 27, 2007  (JP)  ............................. 2007/196199
Jun. 23, 2008  (JP)  ............................. 2008/162975

(51) Int. Cl.
*H01L 41/04* (2006.01)
*B41J 2/45* (2006.01)

(52) U.S. Cl. .................. 310/328; 310/324; 310/358; 310/363; 310/365; 347/68

(58) Field of Classification Search ................. 310/324, 310/358, 363–366, 328; 347/68–72
See application file for complete search history.

(56) References Cited

U.S. PATENT DOCUMENTS

| | | | | |
|---|---|---|---|---|
| 6,502,930 | B1 * | 1/2003 | Shimada et al. | 347/71 |
| 6,869,170 | B2 * | 3/2005 | Shimada et al. | 347/68 |
| 2002/0011986 | A1 * | 1/2002 | Hasegawa et al. | 345/108 |
| 2002/0066524 | A1 * | 6/2002 | Kagawa et al. | 156/235 |
| 2005/0157093 | A1 * | 7/2005 | Murai | 347/69 |

FOREIGN PATENT DOCUMENTS

JP  2002-205410 A  7/2002
JP  2004-96069 A  3/2004

* cited by examiner

*Primary Examiner*—J. SanMartin
(74) *Attorney, Agent, or Firm*—Birch, Stewart, Kolasch & Birch, LLP

(57) ABSTRACT

In a piezoelectric device, a first electrode, a first piezoelectric film, a second piezoelectric film, and a second electrode are formed in this order on a first electrode formed above a surface of the substrate, and an intermediate electrode is arranged between the first and second piezoelectric films. Each of the first and second piezoelectric films has a thickness of 10 micrometers or smaller, and has a first surface facing toward the substrate and a second surface opposite to the first surface. At least one of the first and second surfaces has an arithmetic average surface roughness (Ra) of 0.5 micrometers or smaller.

14 Claims, 6 Drawing Sheets

PIEZOELECTRIC DEVICE, PIEZOELECTRIC ACTUATOR, AND LIQUID DISCHARGE DEVICE HAVING PIEZOELECTRIC FILMS

BACKGROUND OF THE INVENTION

1. Field of the Invention

The present invention relates to a piezoelectric device, a piezoelectric actuator using the piezoelectric device, and a liquid discharge device using the piezoelectric device.

2. Description of the Related Art

Currently, demands for downsizing of piezoelectric devices, as well as semiconductor devices, are increasing with the development of the microprocessing and micromachining. For example, the piezoelectric devices constituted by a piezoelectric body and electrodes are used as actuators installed in inkjet recording heads. In the piezoelectric devices, the piezoelectric body expands and contracts in correspondence with increase and decrease in the strength of an electric field applied from the electrodes to the piezoelectric body. In order to improve the image quality, it is necessary to increase the installation density of piezoelectric devices constituting each inkjet recording head. In the case where high installation density of the piezoelectric devices are required, it is preferable to minimize the thickness of the piezoelectric body used in each piezoelectric device from the viewpoint of the precision of the processing or machining. Specifically, piezoelectric devices having thin piezoelectric films and exhibiting satisfactory piezoelectric performance are currently demanded. In particular, in the case where the piezoelectric devices are used for discharging ink having high viscosity, high piezoelectric performance is required.

Among the piezoelectric devices using a sintered bulk piezoelectric body, the bimorph-type piezoelectric device is known as a piezoelectric device which can achieve high piezoelectric performance by using a conventional piezoelectric material. The bimorph-type piezoelectric device has a structure in which an intermediate electrode is sandwiched by two piezoelectric bodies. When a predetermined voltage is applied to the bimorph-type piezoelectric device, strain is produced in each of the two piezoelectric bodies. Therefore, the bimorph-type piezoelectric device can produce greater strain than the common piezoelectric device which contains only one piezoelectric body. However, improvement in the stability in the piezoelectric performance, the manufacturing efficiency, and the reliability of the bimorph-type piezoelectric devices are currently required.

Japanese Unexamined Patent Publication No. 2004-096069 (hereinafter referred to as JP2004-096069A) discloses a piezoelectric actuator in which a bimorph-type piezoelectric device is formed on a surface of a diaphragm, a driving electrode is arranged between upper and lower piezoelectric layers in the bimorph-type piezoelectric device, and the upper piezoelectric layer has greater thickness than the lower piezoelectric layer. JP2004-096069A also discloses that the deformation stability can be enhanced when the sum of the thicknesses of the upper and lower piezoelectric layers is approximately 20 micrometers. In addition, JP2004-096069A further discloses that when the bimorph-type piezoelectric device is arranged so that the upper piezoelectric layer covers the driving electrode, air discharges and malfunctions caused by short circuit can be prevented, and therefore the reliability can be increased.

Further, Japanese Unexamined Patent Publication No. 2002-205410 (hereinafter referred to as JP2002-205410A) discloses a process for producing an inkjet recording head having a plurality of pressure chambers which contain ink. Each of the pressure chambers is formed with a plurality of walls including side walls. One of the walls is realized by a vibrating surface of a piezoelectric device, so that the pressure imposed on the ink in each pressure chamber is controlled by vibrating the vibrating surface of a piezoelectric device, and the ink can be externally discharged through a nozzle connected to the pressure chamber. The piezoelectric device is constituted by a lamination of planar piezoelectric bodies in each of which internal driving electrodes are arranged.

As indicated in the paragraph <0002> in JP2004-096069A, the piezoelectric layers in the piezoelectric device of JP2004-096069A are sintered bodies. In addition, the paragraph <0022> in JP2004-096069A discloses that the piezoelectric layers are baked in one operation after the piezoelectric layers are shaped together with electrodes. However, the surface roughness of the sintered bodies is great. In particular, when the thickness of a sintered body is as small as approximately 10 micrometers as is the case with the piezoelectric layers in the piezoelectric device of JP2004-096069A, it is difficult to achieve satisfactory uniformness in the sintered body. Further, the surface roughness is likely to become great, since the grain size of the sintered body is as large as approximately several micrometers.

Furthermore, since the layers of the piezoelectric bodies produced in the process disclosed in JP2002-205410A are also sintered bodies, the surface roughness of the piezoelectric bodies in JP2002-205410A is also likely to be great.

In the case where the surface roughness of a piezoelectric body is great, the electric field applied to the piezoelectric body tends to concentrate at the contact points at which the piezoelectric body is in contact with electrodes, so that there is a risk of degrading the piezoelectric body and decreasing the operation lifetime and the operational stability. In particular, when the thickness of the piezoelectric body is small, it is preferable that the surface roughness of the piezoelectric body be as small as possible, since the operation of the piezoelectric device is affected by the degradation of the piezoelectric body. Specifically, when the thickness of the piezoelectric body is 10 micrometers or smaller, the arithmetic average surface roughness Ra is preferably 0.5 micrometers or smaller, more preferably 0.1 micrometers or smaller, and further preferably smaller 500 nanometers or smaller. Therefore, the concentration of the electric field applied to the piezoelectric body is likely to occur in the piezoelectric actuator disclosed in JP2004-96069A, so that there is a fear of being unable to achieve stable piezoelectric performance and reliability.

SUMMARY OF THE INVENTION

The present invention has been made in view of the above circumstances.

The first object of the present invention is to provide a piezoelectric device containing a piezoelectric film and exhibiting high piezoelectric performance and operational stability.

The second object of the present invention is to provide a piezoelectric actuator containing the piezoelectric device which achieves the first object.

The third object of the present invention is to provide a liquid discharge device containing the piezoelectric device which achieves the first object.

(I) In order to accomplish the first object, a piezoelectric device according to the first aspect of the present invention is provided. The piezoelectric device according to the first aspect of the present invention comprises a substrate, a first electrode formed above a surface of the substrate, a first piezoelectric film formed above the first electrode, a second piezoelectric film formed above the first piezoelectric film, a second electrode formed above the second piezoelectric film, and an intermediate electrode arranged between the first and second piezoelectric films. Each of the first and second piezoelectric films has a thickness of 10 micrometers or smaller, and has a first surface facing toward the substrate and a second surface opposite to the first surface, and at least one of the first surface and the second surface has an arithmetic average surface roughness (Ra) of 0.5 micrometers or smaller.

Preferably, the piezoelectric device according to the first aspect of the present invention may further have one or any possible combination of the following additional features (i) to (xi). In addition, preferably, the process according to the first aspect of the present invention may further have one or any possible combination of the following additional features (i) to (iv).

(i) Each of the first and second piezoelectric films is a columnar film formed with a plurality of columnar crystals extending nonparallel to the surface of the substrate.

(ii) At least one of the first and second piezoelectric films is a (100)- or (111)-oriented crystalline film.

(iii) The first and second piezoelectric films are grown by vapor phase deposition.

(iv) The first and second electrodes constitute a ground electrode to which a fixed voltage is applied, and the intermediate electrode constitutes an address electrode to which a variable voltage is applied.

(II) In order to accomplish the second object, a piezoelectric actuator according to the second aspect of the present invention is provided. The piezoelectric actuator according to the second aspect of the present invention comprises the piezoelectric device according the first aspect of the present invention, and an actuator driver which drives the piezoelectric device by applying an electric field to each of the first and second piezoelectric films in the piezoelectric device.

Preferably, the piezoelectric actuator according to the second aspect of the present invention may further have one or any possible combination of the following additional features (v) to (vii). In addition, preferably, the process according to the first aspect of the present invention may further have one or any possible combination of the following additional features (v) to (vii).

(v) The piezoelectric actuator according to the second aspect of the present invention further comprises a diaphragm which is arranged below the first piezoelectric film and externally propagates displacement occurring in the first and second piezoelectric films when the piezoelectric device is driven.

(vi) In the piezoelectric actuator according to the second aspect of the present invention, the first piezoelectric film has a function of a diaphragm which externally propagates displacement occurring in the first and second piezoelectric films when the piezoelectric device is driven.

(vii) In the piezoelectric actuator according to the second aspect of the present invention, the actuator driver has an output voltage of 20 V or lower.

(III) In order to accomplish the third object, a liquid discharge device according to the third aspect of the present invention is provided. The liquid discharge device according to the third aspect of the present invention comprises the piezoelectric actuator according to the second aspect of the present invention; and a discharge member being formed integrally with or separately from the substrate in the piezoelectric device. The liquid discharge device includes a liquid-reserve chamber which reserves liquid, and a liquid-discharge outlet through which the liquid is externally discharged from the liquid-reserve chamber.

(IV) The present invention has the following advantages.

(a) The piezoelectric device according to the first aspect of the present invention is a bimorph-type piezoelectric device which uses piezoelectric films each having a thickness of 10 micrometers or smaller, and the arithmetic average surface roughness (Ra) of at least one surface of the piezoelectric films is 0.5 micrometers or smaller. Since the at least one surface of the piezoelectric films is in contact with an electrode, the concentration of the electric field at points at which at least one surface is in contact with the electrode is less likely to occur. Therefore, when the arithmetic average surface roughness (Ra) of at least one surface of the piezoelectric films is 0.5 micrometers or smaller, it is possible to suppress the degradation, due to the concentration of the electric field, of at least one piezoelectric film which has the at least one surface. Thus, according to the present invention, it is possible to provide a piezoelectric device which has piezoelectric films with the thicknesses of 10 micrometers or smaller, and exhibits high piezoelectric performance and operational stability.

(b) Further, in many cases where piezoelectric films are formed by vapor phase deposition, the piezoelectric films have upward polarization in the as-deposited state. Since the piezoelectric device according to the present invention is the bimorph type, it is possible to drive the piezoelectric device with a positive-output driver in a parallel drive mode by using the intermediate electrode as the address electrode. Therefore, the piezoelectric device according to the present invention can be driven without performing the polarization-inversion processing of the first and second piezoelectric films.

DESCRIPTION OF PREFERRED
EMBODIMENTS

Preferred embodiments of the present invention are explained in detail below with reference to drawings.

1. PIEZOELECTRIC DEVICE AND INKJET
RECORDING HEAD 1.1 Structures

Figure 1:
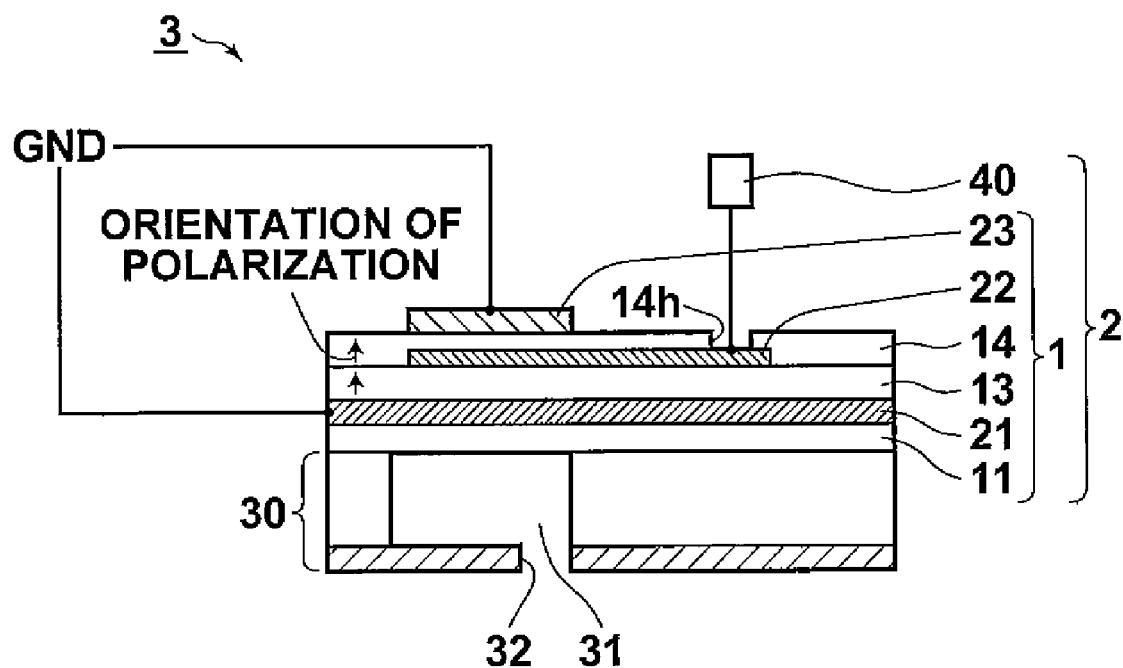
FIG. 1 is a cross-sectional view schematically illustrating a cross section of an essential portion of an inkjet recording head (as a liquid discharge device) having a piezoelectric device according to an embodiment of the present invention.

First, the structures of a piezoelectric device and an inkjet recording head (as an embodiment of the liquid discharge device according to the second aspect of the present invention) according to an embodiment of the first aspect of the present invention are explained below with reference to FIGS. 1 to 3, where the piezoelectric device corresponds to the first aspect of the present invention, and the inkjet recording head corresponds to the third aspect of the present invention. FIG. 1 schematically shows a cross section of an essential portion of an inkjet recording head (as a liquid discharge device) having a piezoelectric device according to an embodiment of the present invention, and FIGS. 2A, 2B, 2C, 2D, 2E, 2F, 2G, 2H, and 2I show cross-sectional views of the structures in respective stages in a process of producing the inkjet recording head of FIG. 1. In FIGS. 1, 2A, 2B, 2C, 2D, 2E, 2F, 2G, 2H, and 2I, the respective elements are illustrated schematically, and the dimensions of the illustrated elements are differentiated from the dimensions of the corresponding elements in the actual system for clarification. The illustrated piezoelectric device is a bimorph-type piezoelectric device in which an intermediate electrode is used as an address electrode so that piezoelectric bodies in the bimorph-type piezoelectric device are driven in a parallel drive mode.

In outline, the inkjet recording head 3 of FIG. 1 comprises a piezoelectric actuator 2 and an ink nozzle 30 (as a member for reserving and discharging liquid), and is formed by attaching the ink nozzle 30 to the back surface of the piezoelectric actuator 2. The ink nozzle 30 is a member for reserving and discharging ink, and comprises an ink chamber 31 (as a liquid-reserve chamber) and an ink outlet 32 (as a liquid-discharge outlet) connected to the ink chambers 31. The ink chambers 31 reserves ink, and the ink held in the ink chambers 31 is discharged out of the ink chambers 31 through the ink outlet 32.

The piezoelectric actuator 2 comprises a piezoelectric device 1 and an actuator driver 40 for driving (applying an electric field to) the piezoelectric device 1. The discharge of the ink from the ink chambers 31 and the discharge amount of the ink are controlled by increasing or decreasing the strength of the electric field applied to the piezoelectric device 1 so as to expand or contract the piezoelectric device 1.

In the normal piezoelectric actuators, a diaphragm which vibrates in response to expansion and contraction of the piezoelectric device is arranged on a back surface of the substrate of the piezoelectric device. However, no diaphragm is provided in the piezoelectric actuator 2 according to the present embodiment. Since the piezoelectric device 1 is constituted by two piezoelectric films (i.e., the first and second piezoelectric films 13 and 14) as explained in detail later, the first piezoelectric film 13 (which is arranged on the lower side) can also have a function of the diaphragm. In addition, part of electrodes and a substrate 11 (which constitute the piezoelectric device 1 as explained in detail later) may also have the function of the diaphragm. For example, a thermally oxidized silicon film or a silicon film formed on a silicon substrate may have the function of the diaphragm.

Instead of attaching the ink nozzle 30 to the back surface of the piezoelectric actuator 2, it is possible to process predetermined portions of the substrate 11 into the ink nozzle 30 so that the ink nozzle 30 is formed integrally with the substrate 11. For example, the ink nozzle 30 can be formed by forming the ink chamber 31 by etching of the substrate 11 from the back surface of the substrate 11 (as illustrated in FIG. 2H), and thereafter attaching the ink outlet 32 (as illustrated in FIG. 2I). Further, in the case where the substrate 11 is a silicon substrate on which a thermally oxidized silicon film ($SiO_2$ film) is formed, the $SiO_2$ film behaves as an etching stopper layer, so that satisfactory etching can be achieved. The etching of substrate 11 can be performed by using a mask of metal such as aluminum which is formed on the back surface of the substrate 11 before the etching.

In the piezoelectric device 1, a lower electrode (corresponding to the aforementioned first electrode) 21, the first piezoelectric film 13, the second piezoelectric film 14, and a second electrode (corresponding to the aforementioned second electrode) 23 are formed in this order on a surface of the substrate 11. In addition, an intermediate electrode 22 is formed between the first piezoelectric film 13 and the second piezoelectric film 14 by patterning.

The lower electrode 21, the first piezoelectric film 13, the intermediate electrode 22, the second piezoelectric film 14, and the second electrode 23 are arranged so that electric fields can be applied to the first piezoelectric film 13 and the second piezoelectric film 14 from the intermediate electrode 22 to the lower electrode 21 and the second electrode 23 along the thickness direction. The piezoelectric actuator 2 operates in a deflection vibration mode. Therefore, the intermediate electrode 22 is patterned together with the first piezoelectric film 13 and the second piezoelectric film 14 so that the driving voltage applied to the address electrode corresponding to each ink chamber 21 can be independently varied. The aforementioned actuator driver 40 in the piezoelectric actuator 2 controls the actuation of the piezoelectric device 1 by varying the voltage applied to the intermediate electrode 22.

The piezoelectric device 1 according to the present embodiment is a parallel polarization type. That is, in the piezoelectric device 1 according to the present embodiment, the spontaneous polarization of the first piezoelectric film 13 and the spontaneous polarization of the second piezoelectric film 14 are oriented in parallel. Specifically, the spontaneous polarization of each of the first piezoelectric film 13 and the second piezoelectric film 14 is upward oriented, the negatively-polarized side of each of the first piezoelectric film 13 and the second piezoelectric film 14 is oriented toward the lower electrode 21, and the positively-polarized side of each of the first piezoelectric film 13 and the second piezoelectric film 14 is oriented toward the second electrode 23. The lower electrode 21 and the second electrode 23 constitute a ground electrode (GND) to which a fixed voltage is applied, and the intermediate electrode 22 is used as an address electrode to which variable voltage is applied. Thus, the piezoelectric device 1 can be driven in a parallel drive mode.

Conventionally, the patterning of a lower electrode in the normal piezoelectric devices which are not the bimorph type is difficult, so that the lower electrode is formed to have a solid (uniform) film structure, and a piezoelectric layer and an upper electrode are formed in separate patterns corresponding to a plurality of ink chambers. Then, the conventional piezoelectric devices which are not the bimorph type are actuated in such a manner that the lower electrode constitutes a ground electrode, and the upper electrode is used as an address electrode.

When a piezoelectric film (in particular, a PZT-based piezoelectric film) is formed by vapor phase deposition such as sputtering, normally, the spontaneous polarization of the piezoelectric film is likely to be oriented upward after the formation unless special poling is performed, although the orientation of the spontaneous polarization generally depends on the composition of the piezoelectric film and the dopant material. The drivers for actuating the piezoelectric devices are usually positive-output drivers (which have positive outputs). Therefore, conventionally, polarization-inversion processing is performed in order to make the spontaneous polarization oriented downward (so that the upper side is negatively polarized and the lower side is positively polarized) before the upper electrode layer is driven by positive-output drivers.

However, after the polarization-inversion processing is performed, the piezoelectric body may not be able to sufficiently deliver the piezoelectric performance which the piezoelectric body can intrinsically deliver. In addition, it is inefficient to perform the polarization-inversion processing of the piezoelectric body which originally has upward polarization.

On the other hand, the piezoelectric device 1 according to the present embodiment can be driven in the parallel drive mode by using the intermediate electrode 22 as the address electrode. Therefore, although the piezoelectric films in the piezoelectric device 1 are formed by vapor phase deposition and have upward spontaneous polarization, the piezoelectric device 1 can be used without the polarization-inversion processing, and driven by using a positive-output driver.

Further, since the lower electrode 21 is formed close to the ink chamber 31, it is preferable that the lower electrode 21 be the ground electrode. If the lower electrode 21 is used as the address electrode, and a high-frequency electric field is applied to the address electrode, the high-frequency electric field is likely to be also applied to the portions of the inkjet recording head 3 around the ink chamber 31, so that the ink in the ink chamber 31 can be electrically decomposed. In the case where the lower electrode 21 is the ground electrode, the piezoelectric actuator 2 can be actuated without deterioration of the ink.

1.2 Production Process

An example of a process for producing the piezoelectric device 1 and the piezoelectric actuator 2 according to the present embodiment is explained below.

FIGS. 2A, 2B, 2C, 2D, 2E, 2F, 2G, 2H, and 2I are cross-sectional views of the structures in respective stages in a process of producing the inkjet recording head 3 of FIG. 1.

Figure 2A:
FIGS. 2A, 2B, 2C, 2D, 2E, 2F, 2G, 2H, and 2I are cross-sectional views of the structures in respective stages in a process of producing the inkjet recording head of FIG. 1.
Figure 3:
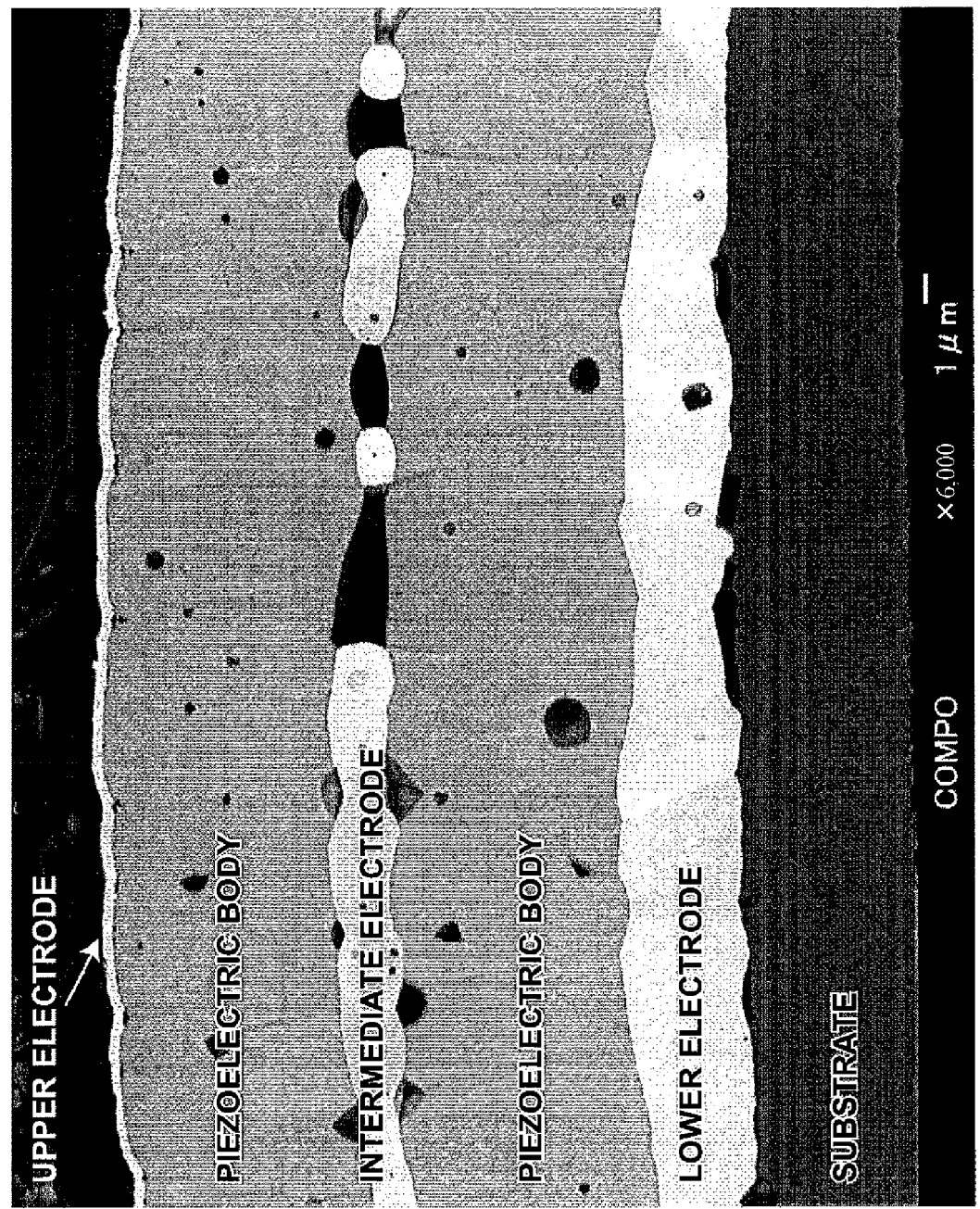
FIG. 3 is an SEM micrograph (scanning electron micrograph) of a cross section, along the thickness direction, of a bimorph-type piezoelectric device produced by using sintered bodies of PZT having a thickness of approximately 7 micrometers which is produced by screen printing.

In the first stage, the substrate 11 is prepared, the lower electrode 21 is formed over the substrate 11, and the first piezoelectric film 13 is formed on the first piezoelectric film 13, as illustrated in FIG. 2A.

The material of the substrate 11 is not specifically limited. For example, the substrate 11 may be made of silicon, glass, stainless steel (SUS), YSZ (yttrium stabilized zirconia), $SrTiO_3$, alumina, sapphire, silicon carbide, or the like. Although the substrate is realized by a laminated substrate such as the SOI (silicon-on-insulator) substrate (which is produced by alternately forming on a surface of a silicon substrate one or more oxide films of $SiO_2$ and one or more Si active layers) and one of the Si active layers is used as a diaphragm in many piezoelectric devices designed to use a diaphragm, the diaphragm is unnecessary in the piezoelectric actuator 2 according to the present embodiment, and therefore the use of the SOI substrate (which is expensive) is also unnecessary in the piezoelectric actuator 2. Thus, the piezoelectric actuator 2 containing the piezoelectric device 1 according to the present embodiment is advantageous in that the piezoelectric actuator 2 can be formed in small size at low cost.

Further, it is possible to provide the substrate 11 with a buffer layer 12 (as illustrated in FIG. 2A) for realizing satisfactory lattice matching. For example, when a silicon substrate which has a thermally oxidized film is used as the substrate 11, the thermally oxidized film can have the function of the buffer layer 12, and suppress defects produced by lattice mismatching and the like.

The material of the lower electrode layer 21 is not specifically limited, and the lower electrode layer 21 may be formed of, for example, one or a combination of metals such as Au, Pt, and Ir and metal oxides such as $IrO_2$, $RuO_2$, $LaNiO_3$, and $SrRuO_3$. Further, the lower electrode 21 may contain as one or more main components nonnoble metals such as Cr, W, Ti, Al, Fe, Mo, In, Sn, Ni, Cu, Co, and Ta, and alloys of these nonnoble metals.

The manner of forming the lower electrode layer 21 is not specifically limited, and may be, for example, vapor phase deposition using plasma such as sputtering, ion beam sputtering, ion plating, plasma CVD (chemical vapor deposition), and the like.

The thickness of forming the lower electrode layer 21 is not specifically limited, and is preferably 300 nm or smaller, since too thick lower electrodes can have too much rigidity and restrict the displacement in the piezoelectric films.

Further, it is possible to form an adhesion layer before the formation of the lower electrode 21 in order to make the lower electrode 12 satisfactorily adhere to the substrate 11. For example, in the case where an electrode of iridium is formed over a silicon substrate, it is possible to form an adhesion layer of titanium.

The material of the first piezoelectric film 13 is not specifically limited. For example, it is preferable that the first piezoelectric film 13 be basically formed of one or more perovskite oxides, although the first piezoelectric film 13 may contain inevitable impurities. It is further preferable that the first piezoelectric film 13 be basically formed of one or more perovskite oxides each having the composition expressed by the compositional formula,

$$A_a B_b O_3, \qquad (P)$$

where A represents one or more A-site elements, B represents one or more B-site elements, and O represents oxygen atoms. The one or more A-site elements include lead (Pb), and the one or more B-site elements are one or more of Ti, Zr, V, Nb, Ta, Cr, Mo, W, Mn, Sc, Co, Cu, In, Sn, Ga, Zn, Cd, Fe, Ni, and the lanthanide elements. Although normally a=1.0 and b=1.0, the value of each of a and b may deviate from 1.0 within a range in which the composition expressed by the compositional formula $A_a B_b O_3$ can realize a perovskite structure. Specifically, the one or more perovskite oxides for the first piezoelectric film 13 may be:

(1) lead compounds such as lead titanate, lead titanate zirconate (PZT), lead zirconate, lead lanthanum titanate, lead lanthanum titanate zirconate, lead magnesium niobate-lead zirconium titanate, lead nickel niobate-lead zirconium titanate, and the like;

(2) nonlead compounds such as barium titanate, bismuth sodium titanate, bismuth potassium titanate, sodium niobate, potassium niobate, lithium niobate, and the like; and (3) one or more mixtures of crystals of the perovskite oxides each having the composition expressed by the compositional formula (P).

Furthermore, it is preferable that the first piezoelectric film 13 be basically formed of one or a mixture of crystals of PZT and the B-site substituted PZTs having the composition expressed by the compositional formula,

$$Pb_a(Zr_{b1}Ti_{b2}X_{b3})O_3, \qquad (P-1)$$

where X represents one or more of the Group V and Group VI metal elements, a>0, b1>0, b2>0, and b3>0. Although normally a=1.0 and b1+b2+b3=1.0, the value of each of a and b1+b2+b3 may deviate from 1.0 within a range in which the composition expressed by the compositional formula $Pb_a(Zr_{b1}Ti_{b2}X_{b3})O_3$ can realize a perovskite structure.

From the viewpoint of the downsizing of the piezoelectric device, it is more preferable that the first piezoelectric film 13 have a smaller thickness. Specifically, the thickness of the first piezoelectric film 13 in this embodiment is 10 micrometers or smaller, and is preferably 1 to 5 micrometers. The manner of forming the first piezoelectric film 13 is not specifically limited, and may be, for example, vapor phase deposition using plasma such as sputtering, ion beam sputtering, ion plating, plasma CVD (chemical vapor deposition), and the like.

In the case where the thickness of the first piezoelectric film 13 is 10 micrometers or smaller, the first piezoelectric film 13 can be formed by, for example, screen printing. However, in this case, the first piezoelectric film 13 has poor uniformness, and the surface roughness of the first piezoelectric film 13 is likely to become great. FIG. 3 shows an SEM micrograph (scanning electron micrograph) of a cross section, along the thickness direction, of a bimorph-type piezoelectric device produced by using sintered PZT bodies having a thickness of approximately 7 micrometers and being produced by screen printing. FIG. 3 shows the poor uniformness of the sintered PZT bodies.

As mentioned in the "Description of the Related Art," in the case where the surface roughness of a piezoelectric body is great, the electric field applied to the piezoelectric body tends to concentrate at the contact points at which the piezoelectric body is in contact with an electrode, so that there is a risk of degrading the piezoelectric body and decreasing the operation lifetime and the operational stability. In particular, in the case where the thickness of the piezoelectric body is small, the operation of the piezoelectric device is more likely to be affected by the degradation of the piezoelectric body. Therefore, in this case, it is preferable that the surface roughness of the piezoelectric body be as small as possible. Although it is preferable that the surface roughness of the surface of the first piezoelectric film 13 on each of the substrate side and the opposite side in the piezoelectric device 1 according to the present embodiment be minimized, it is necessary that the surface roughness of at least the surface of the first piezoelectric film 13 which is farther from the substrate 11 be minimized.

Since the thickness of the first piezoelectric film 13 in the piezoelectric device 1 is limited to 10 micrometers or smaller, when the arithmetic average surface roughness Ra does not exceed 0.5 micrometers, there is no fear that the concentration of the electric field applied to the piezoelectric film at the contact points at which the piezoelectric film is in contact with the electrodes is not so high as to affect the operational characteristics. In the case where the piezoelectric films are formed by vapor phase deposition, even when the thicknesses of the piezoelectric films are 10 micrometers or smaller, it is possible to easily produce the piezoelectric films so that the piezoelectric films have high uniformness and the arithmetic average surface roughness Ra not exceeding 0.5 micrometers. Therefore, it is preferable that the piezoelectric films be formed by vapor phase deposition.

In the case where the direction of an electric field applied to a piezoelectric film is approximately identical to the orientation of a vector component of the spontaneous-polarization axis of the piezoelectric film, the piezoelectric film effectively expands or contracts in response to increase or decrease in the strength of the electric field, i.e., the piezoelectric effect (producing the field-induced strain) effectively works in the piezoelectric film. Therefore, it is preferable that the first piezoelectric film 13 be an oriented crystalline film in which the variations in the orientation of the spontaneous polarization axis are small.

The crystal structure of the first piezoelectric film 13 is not specifically limited, and may be, for example, the tetragonal crystal, the rhombohedral crystal, or a mixture of the tetragonal crystal and the rhombohedral crystal in the case where the first piezoelectric film 13 is formed of a PZT-based material. For example, in the case where the first piezoelectric film 13 is formed of $Pb_{1.3}Zr_{0.52}Ti_{0.48}O_3$, which has the MPB (morphotropic phase boundary) composition, it is possible to realize a tetragonal monocrystalline structure, a mixed structure of the tetragonal crystal and the rhombohedral crystal, or a rhombohedral monocrystalline structure, according to the film-formation condition.

As mentioned before, the first piezoelectric film 13 has the upward spontaneous polarization. Since there is a fear that after the polarization-inversion processing the first piezoelectric film 13 cannot sufficiently deliver the piezoelectric performance which the piezoelectric film can intrinsically deliver, it is preferable that the first piezoelectric film 13 have the upward spontaneous polarization after formation of the PZT-based piezoelectric layer unless special poling is performed.

For example, in the case where the first piezoelectric film 13 contains a rhombohedral phase, i.e., in the case where the first piezoelectric film 13 has the rhombohedral structure or a mixture of the tetragonal structure and the rhombohedral structure, it is preferable that the first piezoelectric film 13 be a (100)- or (111)-oriented crystalline film. Since the spontaneous polarization axis of the rhombohedral crystal is oriented along the <111> direction, the spontaneous polarization axis has a vector component along the upward direction even when the first piezoelectric film 13 is (100) oriented. When the first piezoelectric film 13 is formed by vapor phase deposition, the first piezoelectric film 13 becomes a columnar film formed with a great number of columnar crystals each extending approximately perpendicular to the surface of the substrate under a certain film-formation condition, so that it is relatively easy to make the first piezoelectric film 13 have upward spontaneous polarization. Therefore, as mentioned before, it is preferable that the first piezoelectric film 13 be formed by vapor phase deposition.

Next, in the second stage in the process, the intermediate electrode 22 is formed by patterning. The intermediate electrode 22 may be formed, for example, in a similar manner to the lower electrode 21. However, it is preferable that the intermediate electrode 22 exhibit satisfactory patternability. Although the manner of the patterning of the intermediate electrode 22 is not specifically limited, the intermediate electrode 22 is formed by the liftoff technique in this embodiment as follows.

Figure 2B:
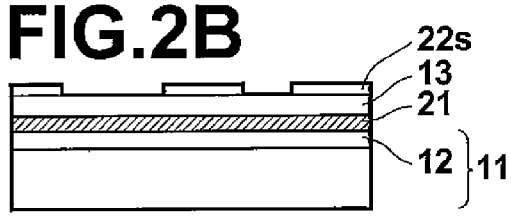
Figure 2C:
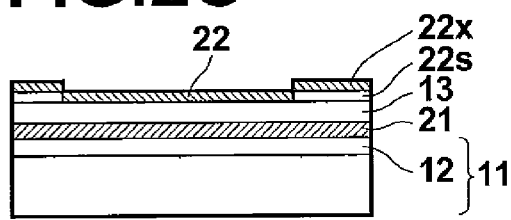
Figure 2D:
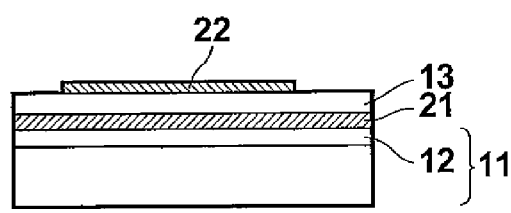

That is, before the material of the intermediate electrode 22 is deposited, a sacrificial layer 22s which can be selectively removed by liftoff is formed, by a patterning technique (such as transfer molding), on predetermined areas of the upper surface of the first piezoelectric film 13 on which the intermediate electrode 22 is not to be formed, as illustrated in FIG. 2B. Then, the material of the intermediate electrode 22 is deposited so as to form a layer 22x over the sacrificial layer 22s and the exposed surfaces of the first piezoelectric film 13 as illustrated in FIG. 2C. Subsequently, the unnecessary portions of the layer 22x, which are located on the sacrificial layer 22s, are removed by liftoff as illustrated in FIG. 2D. Thus, the formation of the intermediate electrode 22 is completed.

The intermediate electrode 22 can be deposited in a similar manner to the lower electrode 21. When the intermediate electrode 22 is deposited by vapor phase deposition, similar to the first piezoelectric film 13, the first piezoelectric film 13 becomes a columnar film formed with a great number of columnar crystals each extending approximately perpendicular to the surface of the substrate under a certain film-formation (deposition) condition. Since adjacent columnar crystals constituting the columnar film can be mechanically separated with ease in the patterning using the liftoff technique, the columnar film can be easily cut along side faces of columnar crystals. Therefore, the liftoff technique can realize highly uniform patterning so that the cut face has a satisfactory shape.

The liftoff can be performed, for example, by oxidizing the sacrificial layer 22s by heat treatment and exfoliating the sacrificial layer 22s, or by dissolving the sacrificial layer 22s with an inorganic solvent which can dissolve the sacrificial layer 22s, or by other manners. The liftoff condition can be appropriately designed according to the constituent material(s) of the sacrificial layer 22s.

Figure 2E:
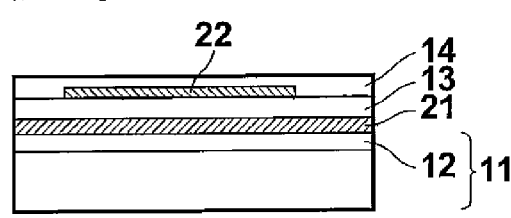
Figure 2F:
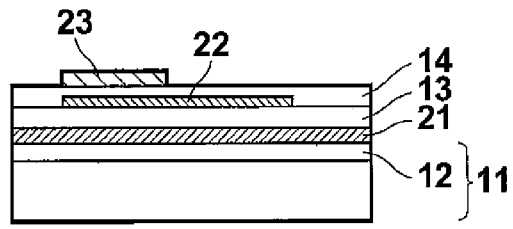
Figure 2G:
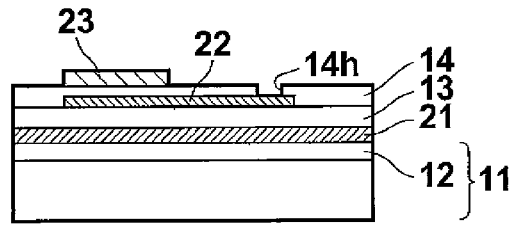
Figure 2H:
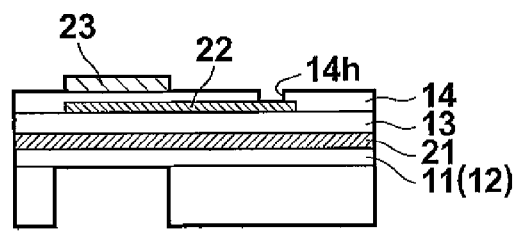
Figure 2I:
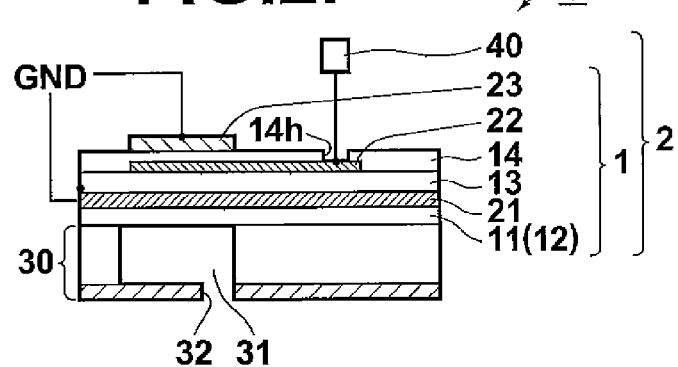

Thereafter, the second piezoelectric film 14 and the second electrode 23 are formed in this order as illustrated in FIGS. 2E and 2F. Then, an access hole 14h is formed as illustrated in FIG. 2G. Thus, the production of the piezoelectric device 1 is completed. The second piezoelectric film 14 may be, for example, a film similar to the first piezoelectric film 13 in the composition, the preferable thickness, the surface roughness, and the manner of film formation.

The second electrode 23 may be, for example, an electrode similar to the intermediate electrode 22 in the composition, the preferable thickness, and the manner of film formation. The second electrode 23 is formed in a pattern at a predetermined position, and the second electrode 23 is further similar to the intermediate electrode 22 in the preferable manner of patterning and the like.

The access hole 14h enables wiring to the intermediate electrode 22 for actuating the first piezoelectric film 13 and the second piezoelectric film 14. For example, the access hole 14h can be produced as illustrated in FIG. 2G by forming an etching pattern for the access hole 14h by photolithography after the formation of the second electrode 23, and performing wet etching or the like using the etching pattern.

Thereafter, the ink chamber 31 is formed by etching of the substrate 11 from the back surface of the substrate 11 as illustrated in FIG. 2H, and then the ink outlet 32 is attached to the back surface of the substrate 11 as illustrated in FIG. 2I.

Finally, the actuator driver 40 is connected to the intermediate electrode 22 through wires as illustrated in FIG. 2I. Thus, the production of the piezoelectric actuator 2 is completed.

1.3 Operations and Advantages of Piezoelectric Device

The actuator driver 40 is a positive-output driver. In addition, as mentioned before, the piezoelectric device 1 according to the present embodiment is a parallel polarization type. In the piezoelectric device 1, both of the spontaneous polarization of the first piezoelectric film 13 and the spontaneous polarization of the second piezoelectric film 14 are oriented upward. When the actuator driver 40 is driven so that an electric field the strength of which does not exceed the magnitude of the coercive electric field is applied to each of the first piezoelectric film 13 and the second piezoelectric film 14, the orientation of the electric field applied to the first piezoelectric film 13 between the lower electrode 21 and the intermediate electrode 22 is opposite to the orientation of the polarization of the first piezoelectric film 13, so that the first piezoelectric film 13 contracts in the thickness direction. On the other hand, at this time, the orientation of the electric field applied to the second piezoelectric film 14 between the second electrode 23 and the intermediate electrode 22 is identical to the orientation of the polarization of the first piezoelectric film 13, so that the second piezoelectric film 14 expands in the thickness direction. Therefore, the total displacement of the piezoelectric device 1 is the sum of the displacement in the first piezoelectric film 13 and the displacement in the second piezoelectric film 14.

Since the displacement achieved in the piezoelectric device 1 according to the present embodiment by application of a voltage is greater than the displacement achieved in the piezoelectric devices having a single piezoelectric layer by application of the same voltage, the actuator driver 40 for driving the piezoelectric actuator 2 which contains the piezoelectric device 1 can be a low-voltage driver, which is inexpensive. For example, even in the case where the actuator driver 40 is a driver having an output voltage of 20 V or lower, it is possible to achieve high piezoelectric performance. In the case where the output voltage of the actuator driver 40 can be suppressed to a low level, it is possible to suppress the fatigue of the piezoelectric films, and improve the durability.

As explained before, the piezoelectric device 1 according to the present embodiment is a bimorph-type piezoelectric device which uses the first and second piezoelectric films 13 and 14 each having a thickness of 10 micrometers or smaller and a surface roughness Ra of 0.5 micrometers or smaller. In this case, since the surface roughnesses Ra of the surfaces at which the first and second piezoelectric films 13 and 14 are respectively in contact with the lower and upper electrodes 21 and 23 are as small as 0.5 micrometers or smaller, the applied electric field is unlikely to concentrate, so that it is possible to suppress the degradation of the first and second piezoelectric films 13 and 14 which can be caused by the concentration of the electric field. Therefore, the piezoelectric device 1 according to the present invention can achieve high piezoelectric performance and operational stability even when the thickness of each of the first and second piezoelectric films 13 and 14 is 10 micrometers or smaller.

Further, in many cases where the first and second piezoelectric films 13 and 14 are formed by vapor phase deposition, the first and second piezoelectric films 13 and 14 have upward polarization in the as-deposited state. Since the piezoelectric device 1 according to the present embodiment is the bimorph type, it is possible to drive the piezoelectric device 1 in a parallel drive mode by using the intermediate electrode 22 as the address electrode. Therefore, the piezoelectric device 1 can be driven without performing the polarization-inversion processing of the first and second piezoelectric films 13 and 14.

1.4. Variations

The piezoelectric device 1 and the piezoelectric actuator 2 containing the piezoelectric device 1 according to the present embodiment may be modified as follows.

Figure 6:
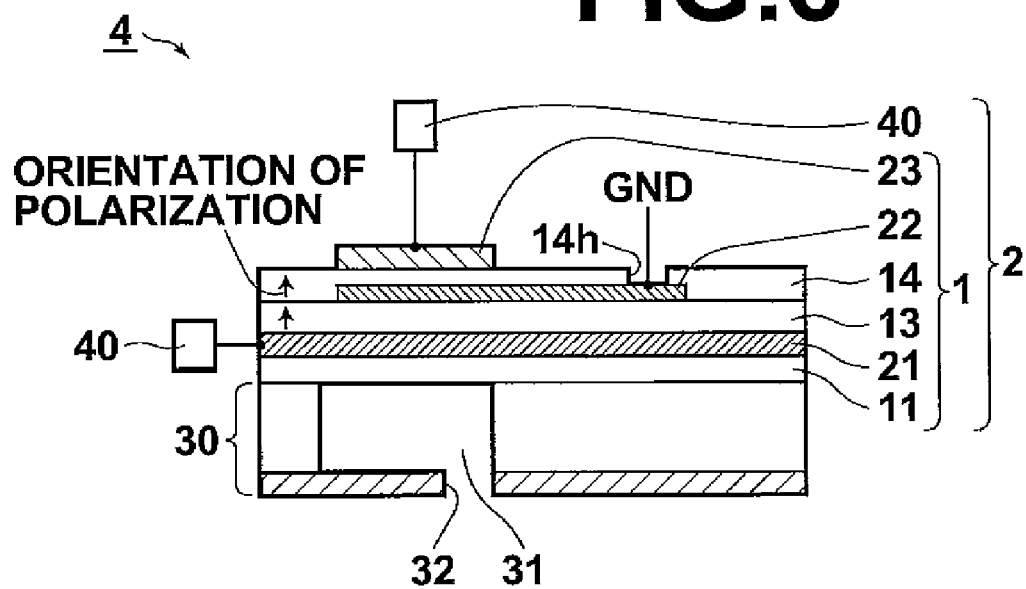
FIG. 6 is a cross-sectional view schematically illustrating a cross section of an essential portion of an inkjet recording head in which an intermediate electrode is a ground electrode.

(1) Although the first and second piezoelectric films 13 and 14 in the piezoelectric device 1 according to the above embodiment have upward polarization, and the piezoelectric device 1 is driven in the parallel drive mode, the orientations of the polarization of the piezoelectric bodies and the manner of driving the piezoelectric bodies are not limited to the orientations and the manner of driving in the explained embodiment. For example, it is possible to use the intermediate electrode 22 as the ground electrode (GND) as illustrated in FIG. 6. Generally, it is possible to select an appropriate direction of actuation by choosing the voltages applied to the lower, intermediate, and upper electrodes and the orientations of the polarization of the piezoelectric bodies.

(2) Although the patterning of the layers including the intermediate electrode 22 in the piezoelectric device 1 according to the explained embodiment is performed by the liftoff technique, the patterning may be performed by photolithography, instead of the liftoff technique. In the case where the photolithography is used, it is preferable that the layers including the intermediate electrode 22 exhibit satisfactory etchability, and be able to be easily patterned by wet etching. In this regard, for example, the intermediate electrode 22 preferably contains iron (Fe) and/or an Iron alloy as one or more main components, and particularly preferably contains stainless steel (SUS) as a main component.

(3) Although, in the explained embodiment, the lower electrode corresponds to the first electrode according to the present invention and the upper electrode corresponds to the second electrode according to the present invention, the piezoelectric device may be arranged so that the upper electrode corresponds to the first electrode according to the present invention and the lower electrode corresponds to the second electrode according to the present invention.

(4) Although the piezoelectric actuator 2 does not have a diaphragm, the piezoelectric actuator 2 may be modified to have a diaphragm.

2. INKJET RECORDING APPARATUS

Figure 4:
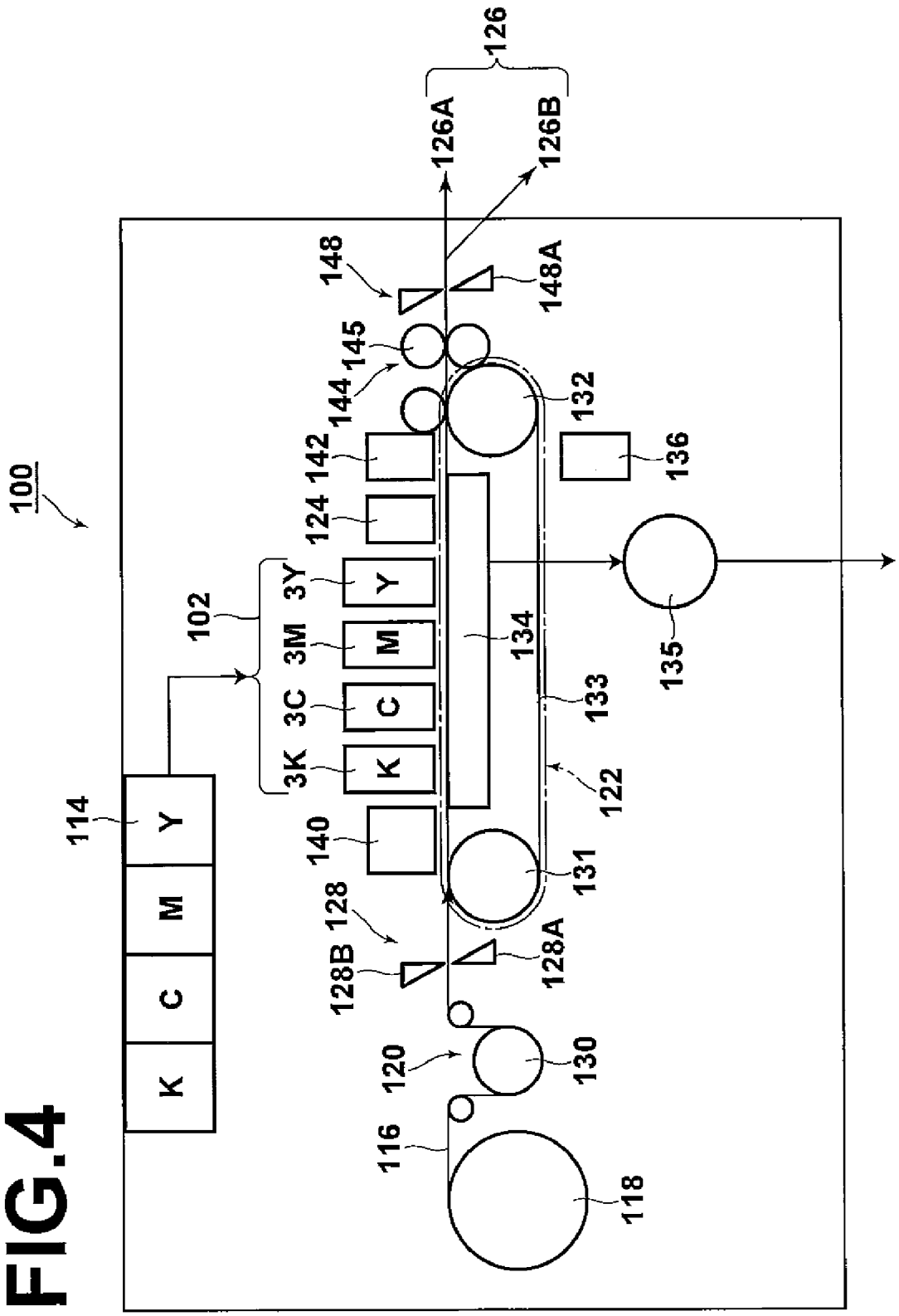
FIG. 4 is a schematic diagram of an example of an inkjet recording apparatus having the inkjet recording head of FIG. 1.
Figure 5:
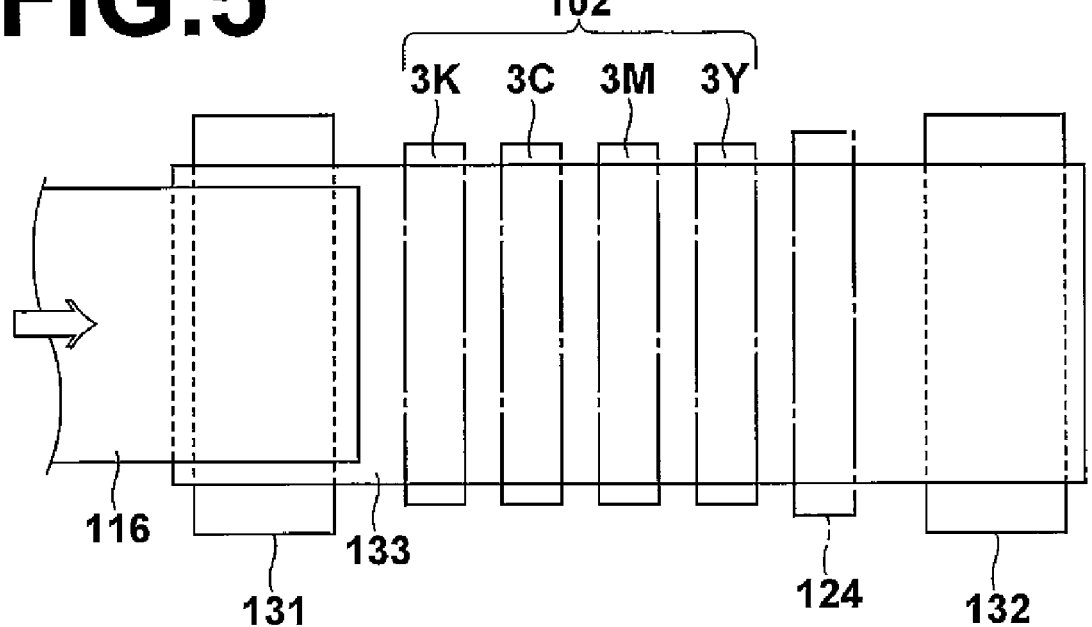
FIG. 5 is a top view of a portion of the inkjet recording apparatus of FIG. 4.

Hereinbelow, an example of an inkjet recording apparatus having the inkjet recording head 3 is explained with reference to FIGS. 4 and 5. FIG. 4 is a schematic diagram illustrating an outline of an example of an inkjet recording apparatus having the inkjet recording head 3 of FIG. 1, and FIG. 5 is a top view of a portion of the inkjet recording apparatus of FIG. 4.

As schematically illustrated in FIG. 4, in outline, the inkjet recording apparatus 100 comprises a printing unit 102, an ink reserve-and-load unit 114, a sheet feeding unit 118, a decurling unit 120, a suction-type belt conveyer 122, a print detection unit 124, and a sheet output unit 126. The printing unit 102 comprises a plurality of inkjet recording heads 3K, 3C, 3M, and 3Y corresponding to inks of different colors (specifically, black (K), cyan (C), magenta (M), and yellow (Y)). Hereinafter, the inkjet recording heads may be referred to as heads. The ink reserve-and-load unit 114 reserves the inks to be supplied to the heads 3K, 3C, 3M, and 3Y. The sheet feeding unit 118 feeds a recording sheet 116. The decurling unit 120 eliminates curl of the recording sheet 116. The suction-type belt conveyer 122 is arranged to face the nozzle faces (ink-discharge faces) of the printing unit 102, and conveys the recording sheet 116 while maintaining the flatness of the recording sheet 116. The print detection unit 124 reads an image printed on the recording sheet 116 by the printing unit 102. The sheet output unit 126 externally outputs the printed recording sheet 116.

Each of the heads 3K, 3C, 3M, and 3Y constituting the printing unit 102 corresponds to the inkjet recording head according to the present embodiment as explained before, although, in order to realize a linear head (explained later), each inkjet recording head used in the inkjet recording apparatus 100 comprises a plurality of piezoelectric devices on the lower electrode 12, and a plurality of ink chambers and a plurality of ink outlets are arranged in correspondence with the arrangement of the plurality of piezoelectric devices on the lower electrode 12.

The decurling unit 120 performs decurling of the recording sheet 116 by heating the recording sheet 116 with a heating drum 130 so as to eliminate the curl produced in the sheet feeding unit 118.

In the case where the inkjet recording apparatus 100 uses roll paper, a cutter 128 for cutting the roll paper into desired size is arranged in the stage following the decurling unit 120. The cutter 128 is constituted by a fixed blade 128A and a round blade 128B. The fixed blade 128A has a length equal to or greater than the width of the conveying path of the recording sheet 116, and is arranged on the side opposite to the print side of the recording sheet 116. The round blade 128B is arranged opposite to the fixed blade 128A on the print side of the recording sheet 116, and moves along the fixed blade 128A. In the inkjet recording apparatuses using cut paper, the cutter 128 is unnecessary.

After the roll paper is decurled and cut into the recording sheet 116, the recording sheet 116 is transferred to the suction-type belt conveyer 122. The suction-type belt conveyer 122 is constituted by rollers 131 and 132 and an endless belt 133. The rollers 131 and 132 are placed apart and the endless belt 133 is looped around the rollers 131 and 132 in such a manner that at least portions of the endless belt 133 which face the nozzle faces of the printing unit 102 and the sensor face of the print detection unit 124 are flat and horizontal.

The endless belt 133 has a width greater than the width of the recording sheet 116, and a great number of suction pores (not shown) are formed through the endless belt 133. A suction chamber 134 is arranged inside the loop of the endless belt 133 at the position opposite to the nozzle faces of the printing unit 102 and the sensor face of the print detection unit 124, and suctioned by a fan 135, so that a negative pressure is generated in the suction chamber 134, and the recording sheet 116 on the endless belt 133 is held by suction.

The power of a motor (not shown) is transmitted to at least one of the rollers 131 and 132 so that the endless belt 133 is driven clockwise in FIG. 4, and the recording sheet 116 held on the endless belt 133 is moved from left to right in FIG. 4.

In the case of borderless printing, ink can be deposited on the endless belt 133. Therefore, in order to clean the endless belt 133, a belt cleaning unit 136 is arranged at a predetermined (appropriate) position outside the loop of the endless belt 133 and the printing region.

A heating fan 140 is arranged on the upstream side of the printing unit 102 above the conveying path of the recording sheet 116, where the conveying path is realized by the suction-type belt conveyer 122. The heating fan 140 blows heated air to the recording sheet 116 before printing so as to heat the recording sheet 116 and facilitate drying of deposited ink.

Each of the heads 3K, 3C, 3M, and 3Y in the printing unit 102 is a so-called full-line type head, which is a linear head having a length corresponding to the maximum width of the recording sheet 116, and being arranged across the width of the recording sheet 116 (i.e., in the main scanning direction perpendicular to the feeding direction of the recording sheet 116) as illustrated in FIG. 5. Specifically, each of the heads 3K, 3C, 3M, and 3Y is a linear head in which the aforementioned plurality of ink-discharge outlets (nozzles) are arrayed over a length exceeding the maximum length of a side of the largest recording sheet 116 on which the inkjet recording apparatus 100 can print an image. The heads 3K, 3C, 3M, and 3Y corresponding to the inks of the different colors are arrayed upstream in this order along the feeding direction as illustrated in FIG. 5. Thus, a color image can be printed on the recording sheet 116 by discharging the inks of the different colors while the recording sheet 116 is conveyed.

The print detection unit 124 may be constituted by, for example, a line sensor which takes an image formed of spots of the inks discharged from the printing unit 102, and detects, from the image taken by the line sensor, incomplete discharge, which can be caused by clogging of a nozzle or the like.

A rear drying unit 142 for drying the printed surface of the recording sheet 116 is arranged in the stage following the print detection unit 124. For example, the rear drying unit 142 is realized by a heating fan or the like. Since it is preferable to avoid contact with the printed surface before the ink on the printed surface is completely dried, it is preferable that the rear drying unit 142 dry the ink on the printed surface by blowing heated air.

In order to control the glossiness of the image printed on the recording sheet 116, a heating-and-pressurizing unit 144 is arranged in the stage following the rear drying unit 142. The heating-and-pressing unit 144 comprises a pressure roller 145 with a surface having predetermined projections and depressions, and transfers the predetermined projections and depressions to the printed surface of the recording sheet 116 by pressing the printed surface with the pressure roller 145 while heating the printed surface.

Finally, the printed recording sheet 116 produced as above is outputted from the sheet output unit 126. It is preferable to separately output test prints and prints for practical use. Therefore, the sheet output unit 126 includes a first output unit 126A for the prints for practical use and a second output unit 126B for the test prints. Although not shown, the inkjet recording apparatus 100 further comprises a sorting unit. The sorting unit sorts the printed recording sheets 116 into the test prints and the prints for practical use, and sends the test prints to the first output unit 126B, and the prints for practical use to the second output unit 126A.

Further, in the case where the size of the recording sheet 116 is large, and both of a test image and an image for practical use are concurrently printed on the recording sheet 116, it is possible to arrange a cutter 148, and separate a first portion of the recording sheet 116 on which the test image is printed and a second portion of the recording sheet 116 on which the image for practical use is printed.

3. CONCRETE EXAMPLES OF THE PRESENT INVENTION

The present inventors have produced a concrete example of the bimorph-type piezoelectric device according to the present invention and a comparison example of a conventional unimorph-type piezoelectric device as indicated below.

3.1 Concrete Example

The concrete example of the bimorph-type piezoelectric device according to the present invention has been produced as indicated below.

Figure 7:
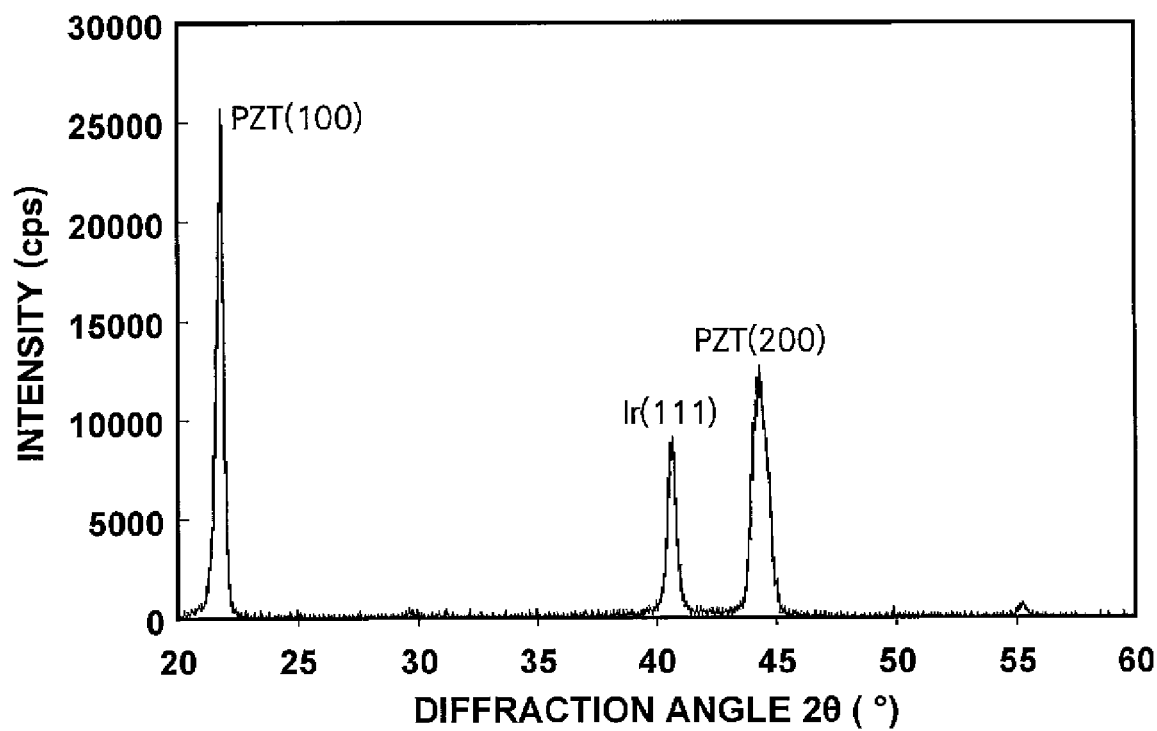
FIG. 7 is an XRD (X-ray diffraction) profile of a Nb-PZT film in a concrete example.

A substrate of silicon (Si) having a thermally oxidized film has been prepared, and an adhesion layer of Ti having a thickness of 10 nm and a lower electrode of Ir having a thickness of 150 nm have been formed in this order on the Si substrate by sputtering at the film-formation temperature of 150° C. Subsequently, a first piezoelectric film of Nb-doped PZT (hereinafter referred to as Nb-PZT) having a thickness of 5 micrometers has been formed by using a target of $Pb_{1.3}((Zr_{0.52}Ti_{0.48})_{0.9}Nb_{0.1})O_3$ having a diameter of 120 mm in the atmosphere of a mixture of Ar and 1.0 volume percent of $O_2$ with the vacuum degree of 0.5 Pa under a condition that the film-formation temperature is 480° C. and the rf power is 500 W. FIG. 7 shows an XRD (X-ray diffraction) profile of the first piezoelectric (Nb-PZT) film in the concrete example.

The XRD profile of FIG. 7 indicates that the Nb-PZT film is a (100)-oriented crystalline film having a degree of orientation of 90% or higher. In addition, the piezoelectric constant $d_{31}$ of the Nb-PZT film has been measured to be 250 pm/V by using a cantilever. Further, the orientation of the polarization of the Nb-PZT film has been examined, and the Nb-PZT film has been found that the lower side is negatively polarized and the upper side is positively polarized.

Next, resist for liftoff (AZ-5214 available from AZ Electronic Materials (Japan) K.K.) has been formed as a sacrificial layer on predetermined areas of the upper surface of the first piezoelectric film on which the intermediate electrode is not to be formed. Subsequently, an adhesion layer of Ti having a thickness of 10 nm and an electrode of Ir having a thickness of 150 nm have been formed in this order over the sacrificial layer and the exposed surfaces of the first piezoelectric film by sputtering at the film-formation temperature of 120° C., and then the unnecessary portions of the Ir electrode have been removed by liftoff so as to leave the Ir intermediate electrode.

Thereafter, the second piezoelectric film has been formed over the Ir intermediate electrode in a similar manner to the first piezoelectric film. Then, an adhesion layer of Ti and an upper electrode of Ir have been formed and patterned in a similar manner to the adhesion layer and the electrode for the intermediate electrode, so that the upper electrode of Ir having the dimensions of 130×680 micrometers has been formed.

Finally, a patterning mask for producing an ink chamber has been formed on the back surface of the Si substrate by forming a film of aluminum (Al) having a thickness of 300 nm and performing patterning the Al film by photolithography. Subsequently, the ink chamber has been formed by performing RIE (reactive ion etching) of the Si substrate to the depth reaching the thermally oxidized film by using the patterning mask. Then, an ink nozzle having an ink outlet has been formed. Thus, an inkjet recording head having a diaphragm structure and dimensions of 180×720 micrometers has been obtained.

The above inkjet recording head has been actuated by using the intermediate electrode as the address electrode and the lower and upper electrodes as the ground electrode, and applying a voltage having a rectangular waveshape and a frequency of 30 kHz to the intermediate electrode from a positive-output driver having an output voltage of 30 V, and a displacement of approximately 200 nm has been observed. That is, satisfactory actuation of the piezoelectric device and the piezoelectric actuator has been confirmed.

3.2 Comparison Example

The unimorph-type piezoelectric device as the comparison example has been produced as indicated below.

First, a lower electrode and a Nb-PZT film are formed on a substrate in a similar manner to the concrete example except that the substrate is an SOI (silicon-on-insulator) substrate. Then, an adhesion layer of Ti having a thickness of 10 nm and a lower electrode of Ir having a thickness of 150 nm have been formed on the Nb-PZT film and patterned by liftoff in a similar manner to the manner in which the intermediate electrode in the concrete example are formed.

Thereafter, the SOI substrate has been etched by RIE, in a similar manner to the etching of the substrate in the concrete example, from the back surface to such a depth that the thickness of the diaphragm remains. Thus, an inkjet recording head having a diaphragm structure and dimensions of 180×720 micrometers has been produced.

The above inkjet recording head has been actuated by using the lower electrode as the address electrode and the upper electrode as the ground electrode under a similar condition to the concrete example, and a displacement of approximately 120 nm has been observed. That is, the displacement observed in the comparison example is approximately 60% of the displacement observed in the concrete example.

4. INDUSTRIAL USABILITY

The piezoelectric devices according to the present invention can be preferably used in piezoelectric actuators, diaphragms, and the like, where the piezoelectric actuators may be mounted in the inkjet recording heads, magnetic recording-and-reproduction heads, MEMS (micro electromechanical systems) devices, micropumps, ultrasonic probes, and the like.

What is claimed is:

1. A piezoelectric device comprising:
a substrate;
a first electrode formed above a surface of said substrate;
a first piezoelectric film formed above said first electrode;
a second piezoelectric film formed above said first piezoelectric film;
a second electrode formed above said second piezoelectric film; and
an intermediate electrode arranged between said first piezoelectric film and said second piezoelectric film;
wherein each of said first piezoelectric film and said second piezoelectric film has a thickness of 10 micrometers or smaller, and has a first surface facing toward said substrate and a second surface opposite to the first surface, and at least one of the first surface and the second surface has an arithmetic average surface roughness (Ra) of 0.5 micrometers or smaller; and
the first piezoelectric film and the second piezoelectric film are formed by vapor phase deposition, and have upward polarization in the as-deposited state.

2. A piezoelectric device according to claim 1, wherein each of said first piezoelectric film and said second piezoelectric film is a columnar film formed with a plurality of columnar crystals extending nonparallel to said surface of the substrate.

3. A piezoelectric device according to claim 1, wherein at least one of said first piezoelectric film and said second piezoelectric film is a (100)-oriented or (111)-oriented crystalline film.

4. A piezoelectric device according to claim 1, wherein said first piezoelectric film and said second piezoelectric film are grown by vapor phase deposition.

5. A piezoelectric device according to claim 1, wherein said first electrode and said second electrode constitute a ground electrode to which a fixed voltage is applied, and said intermediate electrode constitutes an address electrode to which a variable voltage is applied.

6. A piezoelectric actuator comprising:
said piezoelectric device according to claim 1; and
an actuator driver which drives the piezoelectric device by applying an electric field to each of the first piezoelectric film and said second piezoelectric film in the piezoelectric device.

7. A piezoelectric actuator according to claim 6, further comprising a diaphragm which is arranged below said first piezoelectric film and externally propagates displacement occurring in the first piezoelectric film and said second piezoelectric film when said piezoelectric device is driven.

8. A piezoelectric actuator according to claim 6, wherein said first piezoelectric film has a function of a diaphragm which externally propagates displacement occurring in the first piezoelectric film and said second piezoelectric film when said piezoelectric device is driven.

9. A piezoelectric actuator according to claim 6, wherein said actuator driver has an output voltage of 20 V or lower.

10. A liquid discharge device comprising:
said piezoelectric actuator according to claim 6; and
a discharge member being formed integrally with or separately from said substrate in the piezoelectric device and including,
a liquid-reserve chamber which reserves liquid, and
a liquid-discharge outlet through which said liquid is externally discharged from the liquid-reserve chamber.

11. A method for producing a piezoelectric device, which is comprising a substrate; a first electrode formed above a surface of said substrate; a first piezoelectric film formed above said first electrode; a second piezoelectric film formed above said first piezoelectric film; a second electrode formed above said second piezoelectric film; and an intermediate electrode arranged between said first piezoelectric film and said second piezoelectric film, wherein each of said first piezoelectric film and said second piezoelectric film has a thickness of 10 micrometers or smaller, and has a first surface facing toward said substrate and a second surface opposite to the first surface, and at least one of the first surface and the second surface has an arithmetic average surface roughness (Ra) of 0.5 micrometers or smaller, comprising a step of forming at least one of the first piezoelectric film and the second piezoelectric film by vapor phase deposition.

12. A method for producing the piezoelectric device as defined in claim 11, wherein each of first and second piezoelectric films is represented by compositional formula (P), $$A_a B_b O_3 \tag{P}$$

where A represents one or more A-site elements, B represents one or more B-site elements, and O represents oxygen atoms, the one or more A-site elements include lead (Pb), and the one or more B-site elements are one or more of Ti, Zr, V, Nb, Ta, Cr, Mo, W, Mn, Sc, Co, Cu, In, Sn, Ga, Zn, Cd, Fe, Ni, and the lanthanide elements, although normally a=1.0 and b=1.0, the value of each of a and b may deviate from 1.0 within a range in which the composition expressed by the compositional formula $A_a B_b O_3$ can realize a perovskite structure.

13. A method for producing the piezoelectric device as defined in claim 12, wherein each of first and second piezoelectric films is represented by compositional formula (P-1), $$Pb_a(Zr_{b1} Ti_{b2} X_{b3})O_3, \tag{P-1}$$

where X represents one or more of the Group V and Group VI metal elements, a>0, b1 >0, b2>0, and b3=0, although normally a=1.0 and b1+b2+b3=1.0, the value of each of a and b1+b2+b3 may deviate from 1.0 within a range in which the composition expressed by the compositional formula $Pb_a(Zr_{b1} Ti_{b2} X_{b3})O_3$ can realize a perovskite structure.

14. A method for producing the piezoelectric device as defined in claim 11, wherein the vapor phase deposition is selected from a group consisting of sputtering, ion beam sputtering, ion plating, and plasma chemical vapor deposition.

* * * * *